United States Patent [19]
Byun et al.

[11] Patent Number: 5,597,745
[45] Date of Patent: Jan. 28, 1997

[54] METHOD FOR FORMING TIN FILM AND TIN FILM/THIN TISI$_2$ FILM, AND METHOD FOR FABRICATING SEMICONDUCTOR ELEMENT UTILIZING THE SAME

[75] Inventors: Jeong S. Byun; Hak N. Kim, both of Chungcheongbuk-do, Rep. of Korea

[73] Assignee: L G Semicon Co., Ltd., Cheonju, Rep. of Korea

[21] Appl. No.: 423,916

[22] Filed: Apr. 17, 1995

[51] Int. Cl.$^6$ ......................... H01L 21/283; H01L 21/336
[52] U.S. Cl. ..................... 437/41; 437/60; 437/192; 437/194; 437/200; 204/298.13; 204/192.17
[58] Field of Search ..................... 437/190, 192, 437/200, 41, 52, 60, 41 GS, 41 SM, 194; 204/192.15, 192.17, 298.12, 298.13

[56] References Cited

U.S. PATENT DOCUMENTS

| | | | |
|---|---|---|---|
| 4,154,874 | 5/1979 | Howard et al. | 427/91 |
| 4,180,596 | 12/1979 | Crowder et al. | 437/200 |
| 4,566,177 | 1/1986 | Van de Ven et al. | 437/194 |
| 4,837,193 | 6/1989 | Polito et al. | 437/198 |
| 5,108,569 | 4/1992 | Gilboa et al. | 204/192.13 |
| 5,155,063 | 10/1992 | Ito | 437/190 |
| 5,292,678 | 3/1994 | Dhong et al. | 437/50 |
| 5,312,772 | 5/1994 | Yokoyama et al. | 437/190 |
| 5,360,995 | 11/1994 | Graas | 257/751 |
| 5,427,666 | 6/1995 | Mueller et al. | 204/192.17 |

FOREIGN PATENT DOCUMENTS

| | | | |
|---|---|---|---|
| 6-61179 | 3/1994 | Japan | 437/190 |

Primary Examiner—T. N. Quach
Attorney, Agent, or Firm—Alan R. Loudermilk

[57] ABSTRACT

A method for forming a fine-textured titanium nitride film and fine-textured titanium nitride/thin titanium silicide films, and methods for fabricating semiconductor elements utilizing the same are disclosed. A thin titanium silicide film and a fine-textured nitride film are formed on a semiconductor substrate through depositing a titanium film containing nitrogen on the semiconductor substrate by sputtering a titanium target having a titanium nitride film formed thereon and quenching. A bit line of a COB DRAM element may be formed of tungsten, and a tungsten bit line having good contact characteristics and preserved barrier characteristics can be formed since the fine-textured titanium nitride/thin titanium silicide films may serve as a barrier preventing the tungsten from diffusing at high temperature during subsequent capacitor forming processes. The fine-textured titanium nitride/thin titanium silicide films may be applied to an aluminum wiring, and the titanium silicide formed at the contact part may improve the contact characteristics, and TiAl$_3$ formed between the titanium nitride film and the aluminum wiring may improve the electromigration characteristics of the metal wiring.

20 Claims, 7 Drawing Sheets

METHOD FOR FORMING TIN FILM AND TIN FILM/THIN TISI$_2$ FILM, AND METHOD FOR FABRICATING SEMICONDUCTOR ELEMENT UTILIZING THE SAME

FIELD OF THE INVENTION

This invention relates to a method for forming titanium nitride films and titanium nitride/thin titanium silicide films, and methods for fabricating semiconductor elements utilizing the same.

BACKGROUND OF THE INVENTION

In processes for fabricating a semiconductor integrated circuit, sputtering is used for deposition of a Ti film for forming titanium silicide TiSi$_2$ and for deposition of a titanium nitride film TiN used for a diffusion barrier layer.

Conventionally, for depositing a titanium nitride film using a sputtering method, a titanium target may be sputtered under an atmosphere containing a mixed gas of argon Ar and nitrogen N$_2$, with the TiN film deposited on a substrate. As illustrated in FIG. 1, the TiN film is sputtered at a nitrogen ratio of over N1(%), and the deposition rate drops sharply. For depositing a titanium film using a sputtering method, the sputtering is carried out under an atmosphere of pure argon without any mixture of nitrogen (No in FIG. 1).

FIG. 1 is a graph illustrating the rate of deposition of a titanium nitride film depending on the ratio of nitrogen with conventional sputtering.

In case the TiN film is formed with a reactive sputtering method under an atmosphere of nitrogen having a ratio over N1, the surface of the titanium target is corroded to form a titanium nitride film on the surface of the titanium target. Therefore, when the titanium nitride film formed on the surface of the titanium target is sputtered under an atmosphere of mixed gas of N$_2$ and Ar, a titanium nitride film is formed on the surface of the substrate.

The titanium nitride film formed through the foregoing processes serves as a diffusion barrier layer at an interface of, such as, Al/Si or Cu/Si, in a fabrication process of a semiconductor element. The titanium nitride films deposited through the foregoing processes, however, have a columnar structure with a grain size of about 200 Å. Therefore, it has a porous structure with voids between the grains.

Such a columnar structured titanium nitride film, allowing diffusion to progress through the grain boundaries, may allow pin holes to form, making the nitride film unable to serve as a diffusion barrier layer. Moreover, though a single crystal titanium nitride film has a resistivity of 23 μΩ·cm, the titanium nitride film deposited through the above reactive sputtering method has an increased resistivity of 200 to 1000 μΩ·cm due to the columnar structure.

Therefore, in order to have a titanium nitride film functioning perfectly as a diffusion barrier with reduced resistivity, a titanium nitride film of, not a porous structure, but, a fine-textured structure, should be obtained.

SUMMARY OF THE INVENTION

An object of this invention is to provide a method for forming fine-textured titanium films containing excessive nitrogen with a sputtering method using a titanium target having a titanium nitride film formed on the surface thereof.

Another object of this invention is to provide a method for forming a fine-textured titanium nitride film having excellent thermal stability and conductivity.

Another object of this invention is to provide a method for forming a fine-textured titanium nitride/thin titanium silicide films having excellent thermal stability and conductivity.

Still another object of this invention is to provide a method for fabricating an MOS transistor using the method for forming a fine-textured titanium nitride/thin titanium silicide film.

A further object of this invention is to provide a method for fabricating a COB (Capacitor on Bit Line) DRAM using the method for forming a fine-textured titanium nitride/thin titanium silicide film.

Still a further object of this invention is to provide a method for metal wiring of a semiconductor element using the method for forming a fine-textured titanium nitride/thin titanium silicide film.

These objects and other objects and features of this invention may be achieved by providing a method for forming a fine-textured titanium nitride film, including steps of: preparing a titanium target; forming a titanium nitride film on the surface of the titanium target to a designated thickness; forming an oxide film on the surface of a semiconductor substrate; depositing a titanium film containing nitrogen atoms and having a designated thickness on the oxide film by sputtering the target having the titanium nitride film formed thereon; and forming a fine-textured nitride film on the oxide film by annealing the titanium film containing nitrogen atoms.

Other objects and features of this invention may be achieved by providing a method for forming a fine-textured titanium nitride/thin titanium silicide film, including steps of: preparing a titanium target; forming a titanium nitride film on the surface of the titanium target; depositing a titanium film containing nitrogen atoms on a semiconductor substrate by sputtering the target having the titanium nitride film formed thereon; and forming a fine-textured titanium nitride film on the semiconductor substrate and a thin titanium silicide film at the interface of the semiconductor substrate and the fine titanium nitride film by annealing the titanium film containing nitrogen atoms.

Still other objects of this invention may be achieved by providing a method for fabricating an MOS transistor, including steps of: forming a gate oxide film on a first conduction type semiconductor substrate; forming a polysilicon film on the gate oxide film; preparing a titanium target; forming a titanium nitride film on the surface of the titanium target; depositing a titanium film containing nitrogen atoms on the polysilicon film by sputtering the titanium target having the titanium nitride film formed thereon; forming a fine-textured titanium thin film on the polysilicon film, and a thin titanium silicide film between the polysilicon film and the fine-textured nitride film by subjecting the titanium film containing excess nitrogen atoms to an annealing; forming a gate by patterning the titanium nitride film, the thin titanium silicide film and the polysilicon film; and forming impurity regions in the substrate by injecting second conduction type impurity ions into the substrate using the gate as a mask.

Further objects of this invention may be achieved by providing a method for fabricating a COB DRAM, including steps of: forming a second conduction type impurity region in a first conduction type semiconductor substrate; forming an insulation film on the semiconductor substrate having the impurity region formed therein; forming contact holes by removing the insulation film on the impurity region; preparing a titanium target; forming a titanium nitride film on the surface of the titanium target; depositing a titanium film containing nitrogen atoms on the overall surface of the substrate by sputtering the titanium target having the titanium nitride film formed thereon; forming a titanium nitride film on the overall surface of the substrate, and forming a thin titanium silicide film at the interface of the impurity region and the titanium nitride film inside of the contact hole by annealing the titanium film containing nitrogen atoms; forming a metal layer for a bit line on the titanium nitride film; forming a bit line so as to make contact with the impurity region through the contact holes by patterning the titanium nitride film and the metal layer; and forming a capacitor by carrying out a general capacitor forming process.

Still further objects of this invention may be achieved by providing a method for forming metal wiring on a semiconductor element, including steps of: forming a second conduction type impurity region in a first conduction type semiconductor substrate; forming an insulation film on the semiconductor substrate having the impurity region formed therein; forming a contact hole by removing the insulation film on the impurity region; preparing a titanium target; forming a titanium nitride film on the surface of the titanium target; depositing a titanium film containing nitrogen atoms on the overall surface of the substrate by sputtering the titanium target having the titanium nitride film formed thereon; depositing an aluminum layer for metal wiring on the titanium film containing nitrogen atoms by subjecting the aluminum to a flowing at a high temperature and, at the same time, forming both a titanium nitride film over the surface of the substrate and a thin titanium silicide film at the interface of the impurity regions and the titanium nitride film; and forming metal wiring by patterning the titanium film and the aluminum layer.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE INVENTION

Embodiments of this invention are to be explained hereinafter, referring to the attached drawings.

A mechanism for forming a fine-textured titanium nitride film in accordance with this invention is to be explained hereinafter, referring to FIG. 3.

Figure 1:
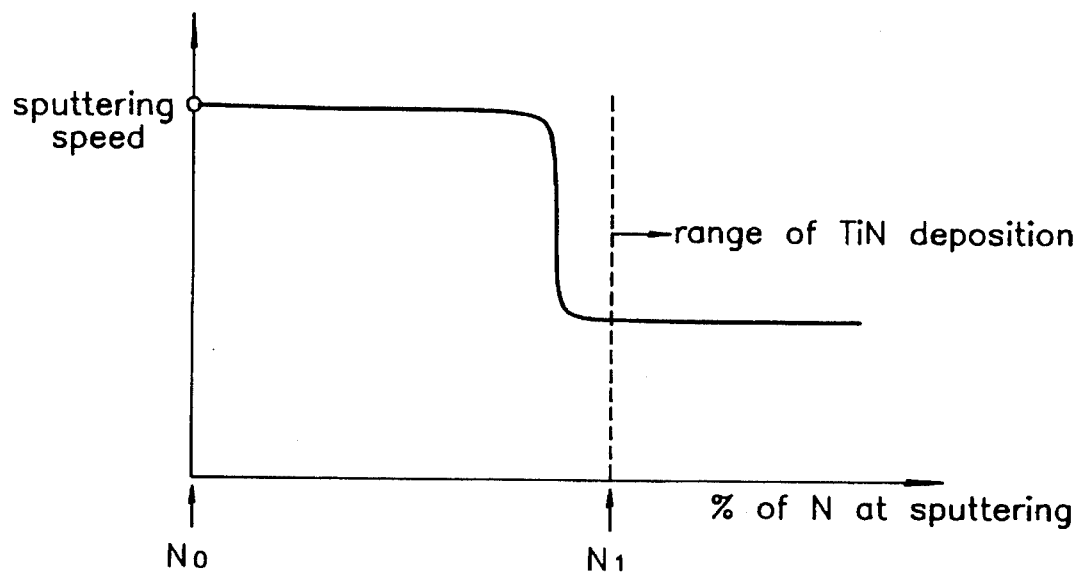
FIG. 1 illustrates the variation of the deposition rate of a titanium film depending on the ratio of nitrogen ($N_2$) with a titanium (Ti) sputtering.
Figure 2:
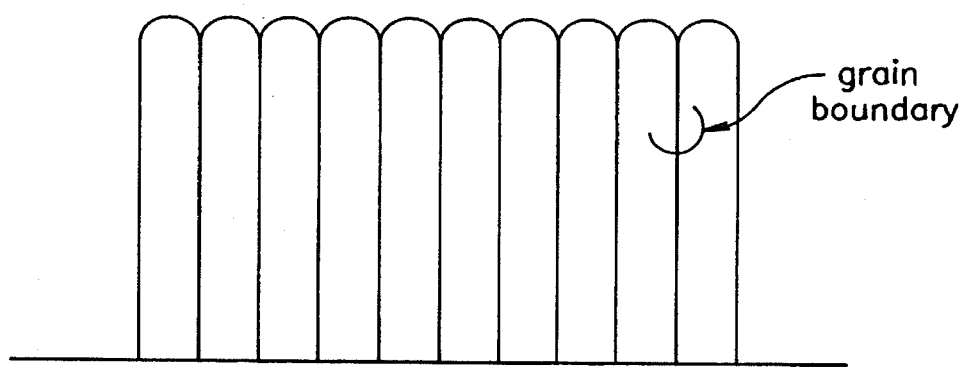
FIG. 2 illustrates the grain structure of a nitride titanium film deposited by a general reactive sputtering method.

When a reactive sputtering process is carried out under an atmosphere of a mixed gas of $N_2$ and Ar with the $N_2$ ratio being over point N1 of FIG. 1, titanium nitride film 11 is formed on the surface of titanium target 10.

Figures 4A, 4B:
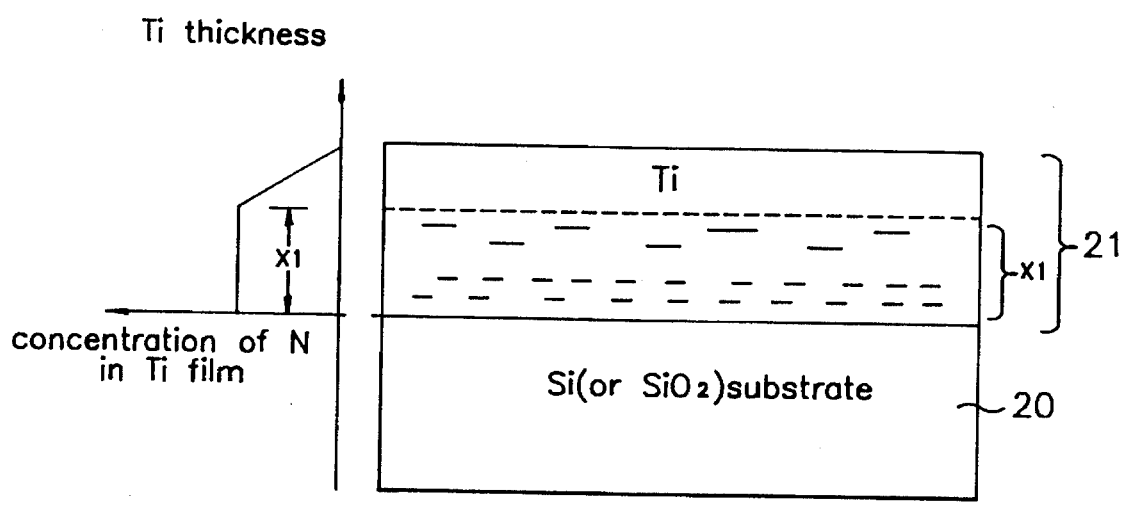
FIG. 4A is a sectional view illustrating the structure of a titanium nitride film formed on a substrate according to the mechanism of FIG. 3.
FIG. 4B illustrates the nitrogen density distribution of a titanium nitride film formed on a substrate according to the mechanism of FIG. 3.

When a reactive sputtering process of titanium target 10 having titanium nitride film 11 formed on the surface thereof through the foregoing process is carried out under an atmosphere of pure argon Ar, i.e, at point No of FIG. 1, where $N_2$ is 0, as illustrated in FIG. 4A, titanium film 21 is formed on the surface of silicon substrate 20.

Figure 3:
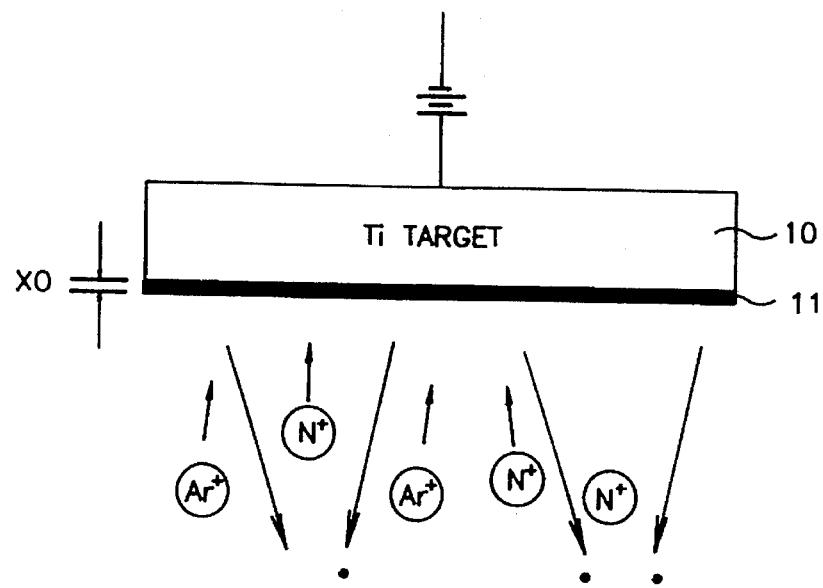
FIG. 3 illustrates a mechanism of formation of a titanium nitride film in accordance with this invention.

The thickness of titanium nitride film 11 formed on the surface of titanium target 10 illustrated as XO in FIG. 3 becomes thicker as the ratio of nitrogen becomes higher.

FIG. 4A is a sectional view illustrating a titanium film deposited on a substrate with sputtering of a titanium nitride film formed on the surface of the titanium target under an atmosphere of pure argon, i.e., under a condition that the ratio of $N_2$ is at point No. As illustrated in FIG. 4A, titanium film 21 is deposited on substrate 20 with the foregoing process, and a nitrogen-containing Ti layer (X1), containing a concentration of nitrogen as illustrated (see FIG. 4A) can be obtained at the interface with substrate 20.

In case a thin titanium film is deposited on a substrate under a condition of no nitrogen, i.e., under an atmosphere of pure argon after the titanium nitride film has been formed on the surface of the titanium target as has been described above, the part X1 of titanium film 21 containing nitrogen corresponds to the thickness XO of titanium nitride film 11 formed on the surface of titanium target 10.

FIG. 4B illustrates the density distribution of nitrogen contained in titanium film 21, wherein the part X1 of titanium film 21 corresponding to X1 contains nitrogen atoms comparable to a TiN film formed by a general method. That is, titanium film 21 has a certain thickness X1 from the interface with the substrate containing about a fixed density of nitrogen atoms and the rest of thickness up to the upper surface of titanium film 21 contains nitrogen atoms decreasing to about zero at the upper surface of titanium film 21.

Figure 5A:
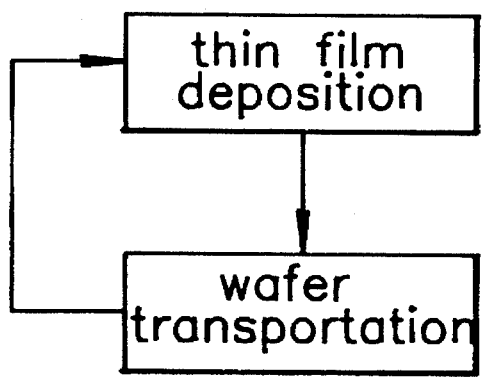
FIGS. 5A and 5B illustrate a conventional process and a process in accordance with this invention, respectively, for depositing a thin film using sputtering methods.
Figure 5B:
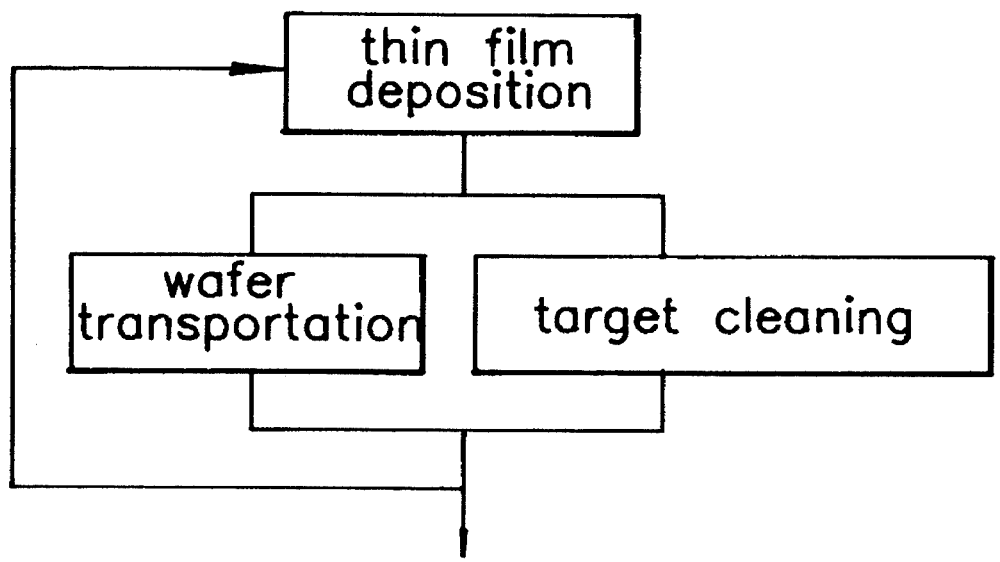

FIGS. 5A and 5B illustrate the general flow of processes for deposition of thin films with sputtering methods. As illustrated in FIG. 5A, a conventional process includes a series of processes in which a wafer has a thin film deposited thereon in a sputter chamber, the wafer is taken out of the sputter chamber upon completion of the deposition, a new wafer is put into the chamber, and the new wafer has a thin film deposited thereon, with the processes carried out repeatedly.

As illustrated in FIG. 5B, however, this invention includes a series of processes for deposition of a thin film in which a wafer has a thin film deposited thereon in a sputter chamber, a target cleaning process for forming a titanium nitride film on the surface of a titanium target with a glow discharge formed under the presence of $N_2$ gas only is carried out during a step for transporting the wafer having the thin film deposited thereon, and a new wafer is transported into the chamber and has a thin film deposited thereon by sputtering the titanium nitride film formed on the surface of the titanium target under an atmosphere of Ar with the processes carried out repeatedly.

At this time, the thickness X1 of a part of the titanium film containing nitrogen corresponds to the thickness X0 of the titanium nitride film formed on the surface of the titanium target of FIG. 3, and the thickness X0 can be controlled by controlling the $N_2\%$ of the sputtering ambient or the power.

The thin film layer in the titanium film containing nitrogen has a Ti-N composition with the contained nitrogen quantity being in the range of about 5 to 45%, and the ratio of the thickness X1 of the part containing about a fixed density of nitrogen to the thickness of the entire titanium film is in the range of about 0.05 to 0.95.

Next, methods for forming a fine-textured titanium film and a fine titanium nitride/thin silicide film using the titanium film formed through the foregoing process are to be explained hereinafter.

Figure 6A:
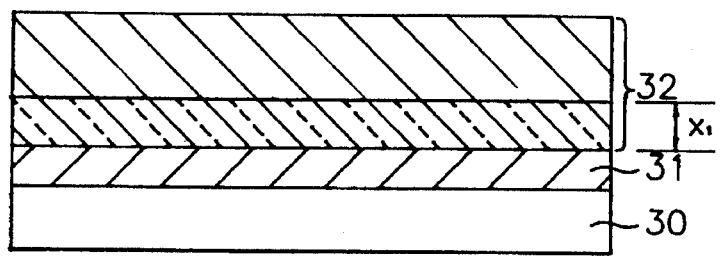
FIGS. 6A and 6B illustrate processes for forming a fine-textured titanium film in accordance with one embodiment of this invention.
Figure 6B:
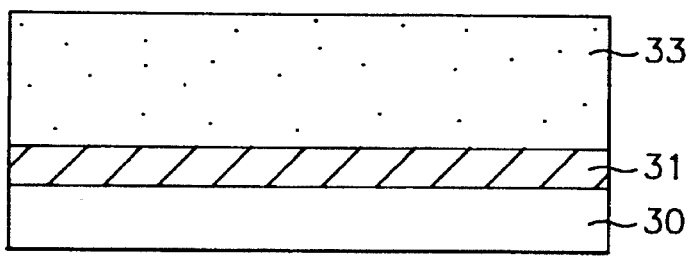

Referring to FIGS. 6A and 6B, a method for forming a fine-textured titanium nitride film in accordance with this invention will be explained hereinafter.

First, titanium film 32 containing nitrogen atoms is formed on silicon substrate 30 having oxide film 31 formed on the surface thereof with a reactive sputtering method. In case a pure titanium thin film is formed on $SiO_2$ making direct contact with the silicon oxide film, since the formation energy of a titanium oxide film is substantially larger than that of the silicon oxide film, the silicon oxide film is decomposed to form a titanium oxide film or a titanium silicide film.

The Gibbs formation free energy of each material is as follows;

$SiO_2$=–231.8 KCal/g.mol, TiO=–139.5 KCal/g.mol, $Ti_2O_3$=–392.2 KCal/g.mol, $Ti_3O_5$=–635.6 KCal/g.mol, $TiO_2$=–242.5 KCal/g.mol, $Ti_5Si_3$=–204.6 KCal/g.mol, TiSi=–46.2 KCal/g.mol, $TiSi_2$=–52.1 KCal/g.mol.

In case of this invention, however, when titanium film 32 having nitrogen contained therein makes direct contact with oxide film 31, reaction between the titanium film-silicon oxide film is inhibited due to the nitrogen contained in titanium film 32.

Accordingly, as illustrated in FIG. 6B, when titanium film 32 containing nitrogen atoms is subjected to an annealing, titanium film 32 is altered into fine-textured titanium nitride film 33, but oxide film 31 under fine titanium nitride film 33 is not damaged even after the annealing because reaction between the titanium film and the oxide film is inhibited by the nitrogen contained in the titanium film.

Figure 7A:
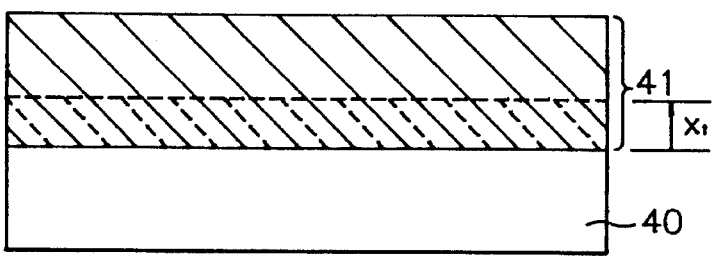
FIGS. 7A and 7B illustrate processes for forming a fine-textured titanium/thin titanium silicide films in accordance with a second embodiment of this invention.
Figure 7B:
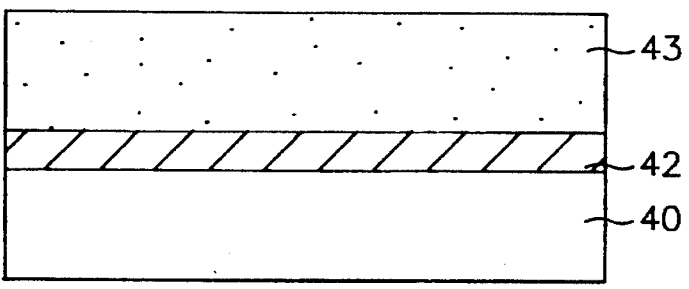

FIGS. 7A and 7B illustrate processes for forming a fine-textured titanium nitride/thin titanium silicide films in accordance with a second embodiment of this invention.

Referring to FIG. 7A, titanium film 41 containing nitrogen atoms is formed on silicon substrate 40, and subjected to an annealing as the same process with above. As illustrated in FIG. 7B, fine-textured titanium nitride film 43 is formed on silicon substrate 40, and thin titanium silicide film 42 is formed at the interface of silicon substrate 40 and the fine-textured titanium nitride film 43 at the same time.

That is, because the reaction of titanium film 41 and silicon substrate 40 is inhibited by the nitrogen atoms contained in the titanium film, as illustrated in FIG. 7B, a uniform and thin titanium silicide film is formed between titanium nitride film 43 and silicon substrate 40.

The heat treatment processes for forming a fine-textured titanium nitride film and fine-textured titanium nitride/thin silicide films as illustrated in FIGS. 6A–6B and 7A–7B may be carried out from 1 to 3 times.

In this invention, the heat treatment process is carried out for 40 seconds at a low temperature of 500° C. at first, then for 30 seconds at a temperature of 800° C. The heat treatment process is carried out under an $N_2$ or $NH_3$ atmosphere.

The reason to carry out the heat treatment for a longer time at a lower temperature is because the titanium nitride film is formed faster than the titanium silicide at a low temperature. Thus, since the titanium nitride film is formed relatively faster compared to the titanium silicide due to the heat treatment process being at a lower temperature, a thin film of titanium silicide can be formed.

FIGS. 8A–8F illustrate an embodiment of the method for forming titanium nitride/thin titanium silicide films as applied to forming a gate electrode of a semiconductor element.

Figure 8A:
FIGS. 8A–8F illustrate processes for fabricating a semiconductor element in accordance with a third embodiment of this invention.
Figure 8B:
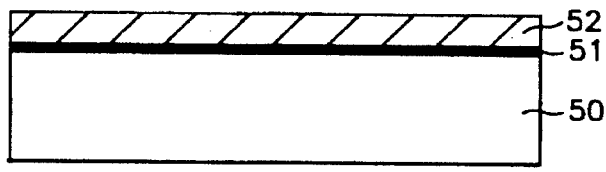

As illustrated in FIG. 8A, gate oxide film 51 having a thickness of about 100 Å is formed on the surface of silicon substrate 50, and, as illustrated in FIG. 8B, doped polysilicon film 52 having a thickness of about 500 Å is formed on gate oxide film 51.

Figure 8C:
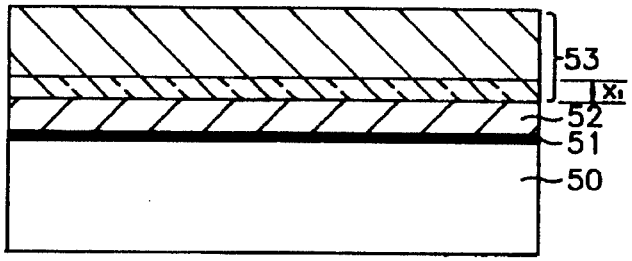

As has been explained with reference to FIG. 3, by carrying out a sputtering of a titanium nitride film formed on the surface of a titanium target under a pure argon atmosphere, titanium film 53 containing nitrogen atoms is formed on polysilicon film 52 to a thickness about of 1000 Å, as illustrated in FIG. 8C.

Figure 8D:
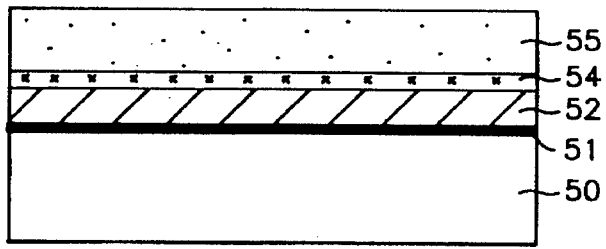

Titanium film 53 containing nitrogen atoms formed in above process is subjected to a heat treatment for 1 to 3 times under an $N_2$ or $NH_3$ atmosphere. In this invention, upon carrying out a primary heat treatment for 40 seconds at about 500° C., and a secondary heat treatment for 30 seconds at about 800° C., as illustrated in FIG. 8D, fine-textured titanium nitride film 55 is formed on polysilicon film 52 and thin titanium silicide film 54 is formed at the interface of polysilicon film 52 and fine-textured titanium nitride film 55.

The reaction of polysilicon film 52 and titanium film 53 also is inhibited in the foregoing process by the nitrogen contained in titanium film 53, resulting in the formation of a thin silicide film between polysilicon film 52 and fine titanium nitride film 55.

Figure 8E:
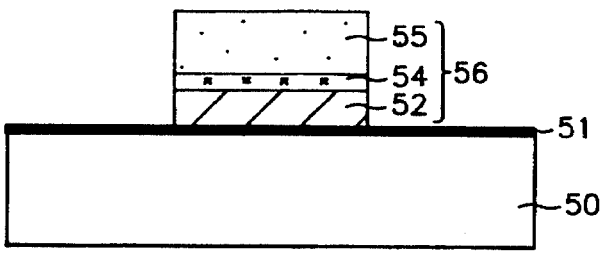

As illustrated in FIG. 8E, by subjecting titanium nitride film 55, thin titanium silicide film 54 and polysilicon film 52 to patterning, gate 56 comprising polysilicon film 52, thin titanium silicide film 54 and titanium nitride film 55 is formed.

Figure 8F:
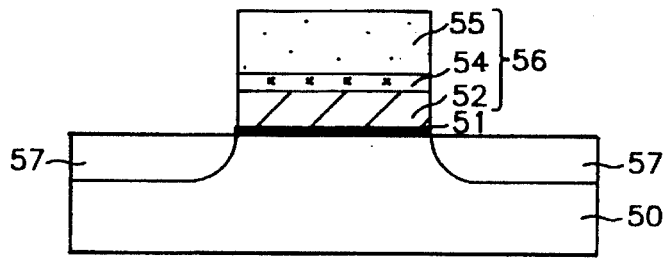

As illustrated in FIG. 8F, upon forming impurity regions 57 for source/drain regions by injecting impurity ions having a conductivity type opposite to the substrate into the substrate with the gate serving as a mask, an MOS transistor can be formed.

FIGS. 9A to 9E illustrate an embodiment of the method for forming titanium nitride/thin titanium silicide films in accordance with this invention as applied to formation of a bit line of a semiconductor element.

Figure 9A:
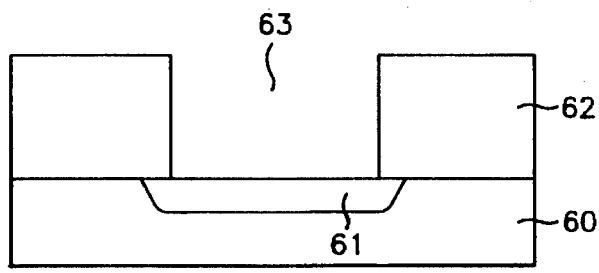
FIGS. 9A–9E illustrate processes for fabricating a semiconductor element in accordance with a fourth embodiment of this invention.

As illustrated in FIG. 9A, impurity region 61 is formed in silicon substrate 60 by injecting impurity ions of a conductivity type opposite to the substrate into substrate 60, and thick oxide film 62 is formed on silicon substrate 60 having impurity region 61 formed therein. Bit line contact hole 63 is formed by removing oxide film 62 over impurity region 61.

Figure 9B:
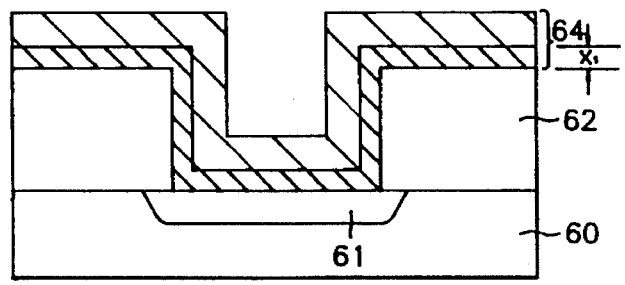

As illustrated in FIG. 9B, titanium film 64 containing nitrogen atoms is formed on the overall surface of the substrate to a thickness of about 500 Å through a sputtering of the titanium target having the titanium nitride film formed thereon. Subjecting the layers to a heat treatment, fine-textured titanium nitride film 65 is formed on the overall surface of the substrate and thin titanium silicide film 66 is formed at the interface of impurity region 61 and fine-textured titanium nitride film 65 inside of the contact hole at the same time as illustrated in FIG. 9C.

Figure 9C:
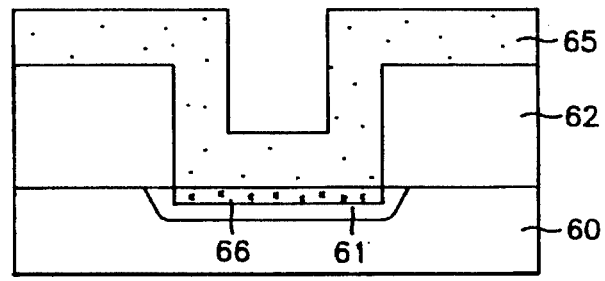

At this time, though titanium silicide film 54 had been formed over the surface of polysilicon film 52 in FIG. 8C due to reaction of polysilicon film 52 with titanium film 53, the titanium silicide film is not formed on oxide film 62 in FIG. 9C due to no reaction of titanium film 64 with oxide film 62, but thin titanium silicide film 66 is formed only inside of bit line contact hole 63 by the reaction of titanium film 64 with impurity region 61.

Figure 9D:
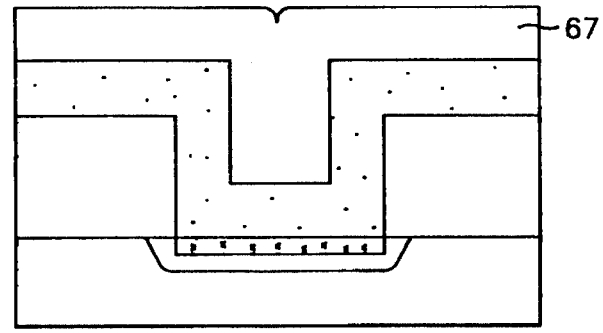
Figure 9E:
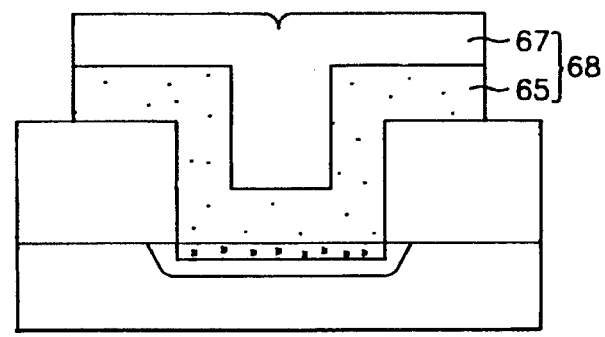

By depositing tungsten 67 on titanium nitride film 65 to a thickness of about 2000 Å with a chemical vapor deposition method as illustrated in FIG. 9D, and subjecting tungsten 67 and titanium nitride film 65 to patterning as illustrated in FIG. 9E, bit line 68 having tungsten 67 and fine-textured titanium nitride film 65 is formed. At this time, due to the contact of bit line 68 with impurity region 61 through titanium silicide 66 inside of contact hole 63, the contact characteristics can be improved.

Thereafter, upon carrying out a general capacitor forming process, a DRAM element in accordance with an embodiment of this invention may be obtained.

In general, when a capacitor forming process is carried out after a bit line is formed, the process for forming a capacitor is like carrying out a heat treatment process for 9 hours at 870° C. This invention, however, can prevent the tungsten from diffusing at high temperature due to the fine-textured titanium nitride film and the titanium silicide serving as diffusion barriers even though a high temperature heat treatment process is carried out. Therefore, a bit line of tungsten having excellent contact characteristics and preserved barrier characteristics can be formed.

FIGS. 10A–10D illustrate an embodiment of the method for forming titanium nitride/thin titanium silicide films in accordance with this invention as applied to a metal wiring of a semiconductor element.

Figure 10A:
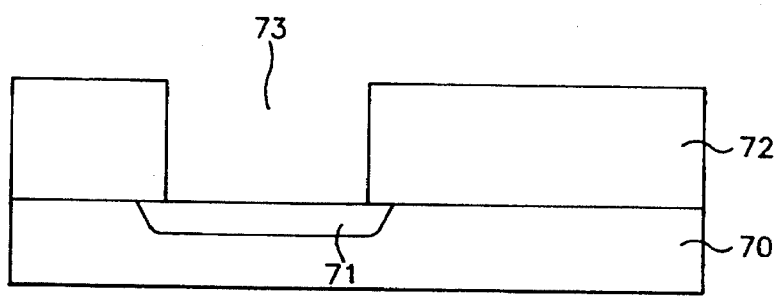
FIGS. 10A–10D illustrate processes for fabricating a semiconductor element in accordance with a fifth embodiment of this invention.

As illustrated in FIG. 10A, impurity region 71 is formed in silicon substrate 70 by injecting impurity ions having a conductivity type opposite to the substrate into silicon substrate 70. Contact hole 73 for forming a metal wiring is formed by forming oxide film 72 on silicon substrate 70 having impurity region 71 formed therein, and removing oxide film 72 over the impurity region 71 as illustrated.

Figure 10B:
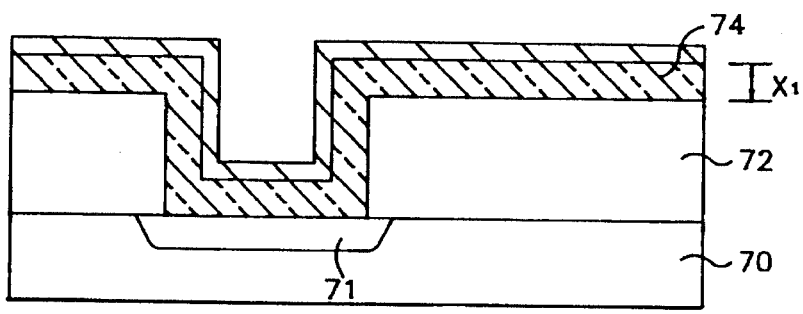

As illustrated in FIG. 10B, titanium film 74 containing nitrogen atoms is formed over the surface of the substrate to a thickness of about 500 Å by sputtering a titanium target having a titanium nitride film formed thereon.

Figure 10C:
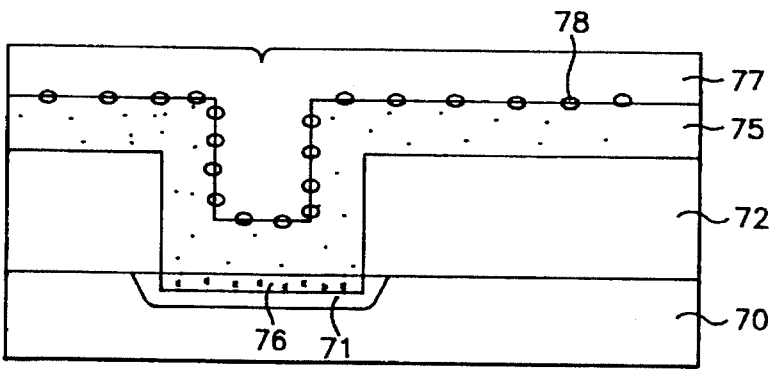
Figure 10D:
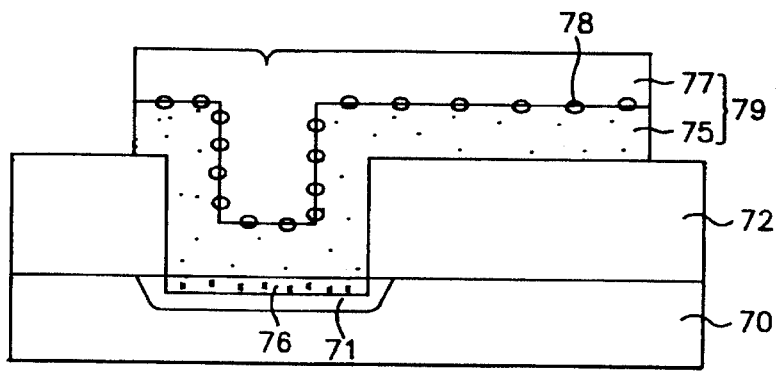

As illustrated in FIG. 10C, aluminum layer 77 for forming a metal wiring is deposited on titanium film 74 containing nitrogen atoms to a thickness of about 5000 Å by forming aluminum at a high temperature of about 550° C. Upon carrying out the high temperature "flowing process" for forming the aluminum layer, fine titanium nitride film 75 is formed on the overall surface of the substrate and thin titanium silicide film 76 is formed at the interface of impurity region 71 and fine-textured titanium nitride film 75 inside of contact hole 73 due to titanium film 74 containing nitrogen atoms being heat treated.

Chemical compounds 78, such as $TiAl_3$, are formed at the interface of titanium nitride film 75 and aluminum layer 77, which may result in improved electromigration characteristics of the metal wiring.

By subjecting formed aluminum layer 77 and titanium nitride film 75 to patterning, metal wiring 79 can be formed.

This invention can facilitate forming of a titanium film containing nitrogen atoms by sputtering a titanium target having a titanium nitride film formed on the surface thereof and obtaining fine-textured titanium nitride/thin titanium silicide films having excellent thermal stability and conductivity by subjecting the films to heat treatment.

By applying the method for forming fine-textured titanium nitride thin titanium silicide films to methods for fabricating an MOS transistor, a COB DRAM or a metal wiring, it is made possible to improve the characteristics of the resulting device.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method of forming a titanium nitride film comprising the steps of:

preparing a titanium target;

forming a titanium nitride film on the titanium target;

forming an oxide film on a semiconductor substrate;

depositing a titanium film containing nitrogen on the oxide film by sputtering under an argon atmosphere the target having the titanium nitride film formed thereon; and forming a nitride film on the oxide film by heat-treating the titanium film.

2. The method of claim 1, wherein the titanium film is subjected to heat-treatment for one to three times.

3. The method of claim 1, wherein the heat-treatment process is carried out for about 40 seconds at a temperature of about 500° C. and for about 30 seconds at a temperature of about 800° C.

4. The method of claim 1, wherein the heat-treatment process of the titanium film is carried out under an $N_2$ or $NH_3$ atmosphere.

5. The method of claim 1, wherein the titanium film includes a portion containing nitrogen, wherein the thickness of the portion of the titanium film containing nitrogen corresponds to the thickness of the titanium nitride film formed on the titanium target.

6. The method of claim 5, wherein nitrogen is contained in the titanium film in a ratio of about 5 to 45%.

7. The method of claim 5, wherein the ratio of the thickness of the portion of the titanium film containing nitrogen to the entire thickness of the titanium film is in the range of about 0.05 to 0.95.

8. A method for forming a titanium nitride/titanium silicide film comprising steps of:

forming a titanium nitride film on a titanium target;

depositing a titanium film containing nitrogen atoms on a semiconductor substrate by sputtering under an argon atmosphere the target having the titanium nitride film formed thereon; and forming a titanium nitride film on the semiconductor substrate and a titanium silicide film at the interface of the semiconductor substrate and the titanium nitride film by heat-treating the titanium film containing nitrogen.

9. The method of claim 8, wherein the titanium film containing nitrogen is subjected to heat-treatment for two times.

10. The method of claim 9, wherein one heat-treatment process includes a heat-treatment for about 40 seconds at a temperature of about 500° C. and another heat-treatment for about 30 seconds at a temperature of about 800° C.

11. The method of claim 8, wherein the heat-treatment process of the titanium film is carried out under an $N_2$ or $NH_3$ atmosphere.

12. The method of claim 8, wherein the titanium film includes a portion containing nitrogen, wherein the thickness of the portion of the titanium film containing nitrogen corresponds to the thickness of the titanium nitride film formed on the titanium target.

13. The method of claim 12, wherein nitrogen is contained in the titanium film in a ratio of about 5 to 45%.

14. The method of claim 12, wherein the ratio of the thickness of the portion of the titanium film containing nitrogen to the entire thickness of the titanium film is in the range of about 0.05 to 0.95.

15. A method for fabricating a semiconductor element comprising the steps of:

forming a gate oxide film on a first conductivity type semiconductor substrate;

forming a polysilicon film on the gate oxide film;

forming a titanium nitride film on a titanium target;

depositing a titanium film containing nitrogen on the polysilicon film by sputtering under an argon atmosphere the titanium target having the titanium nitride film formed thereon;

forming a titanium nitride film on the polysilicon film and a titanium silicide film between the polysilicon film and the titanium nitride film by heat-treating the titanium film containing nitrogen;

forming a gate by patterning the titanium nitride film, the titanium silicide film and the polysilicon film; and forming impurity regions in the substrate by injecting second conductivity type impurity ions into the substrate using the gate as a mask.

16. A method for fabricating a semiconductor element having a capacitor comprising the steps of:

forming a second conductivity type impurity region in a first conductivity type semiconductor substrate;

forming an insulation film on the semiconductor substrate;

forming a contact hole by removing the insulation film over the impurity region;

forming a titanium nitride film on a titanium target;

depositing a titanium film containing nitrogen on the substrate by sputtering under an argon atmosphere the titanium target having the titanium nitride film formed thereon;

forming a titanium nitride film on the substrate and forming a titanium silicide film at the interface of the impurity region and the titanium nitride film inside of the contact hole by heat-treating the titanium film containing nitrogen;

forming a bit line metal layer on the titanium nitride film;

forming a bit line so as to make contact with the impurity region through the contact hole by patterning the titanium nitride film and the metal layer;

forming the capacitor of the semiconductor element by carrying out a capacitor forming process.

17. The method of claim 16, wherein the bit line metal layer comprises tungsten.

18. The method of claim 16, wherein the bit line metal layer is deposited with a chemical vapor deposition method.

19. A method for forming metal wiring on a semiconductor element comprising the steps of:

forming a second conductivity type impurity region in a first conductivity type semiconductor substrate;

forming an insulation film on the semiconductor substrate; forming a contact hole by removing the insulation film over the impurity region;

forming a titanium nitride film on a titanium target;

depositing a titanium film containing nitrogen on the substrate by sputtering under an argon atmosphere the titanium target having the titanium nitride film formed thereon;

depositing an aluminum layer on the titanium film, wherein the aluminum is deposited at a temperature such that a titanium nitride film is formed on the substrate and a titanium silicide film is formed at the interface of the impurity region and the titanium nitride film; and forming the metal wiring by patterning the titanium film and the aluminum layer.

20. The method of claim 19, wherein $TiAl_3$ is formed at the interface of the titanium nitride film and the aluminum layer.

* * * * *